United States Patent
Takahashi et al.

(10) Patent No.: US 8,521,456 B2
(45) Date of Patent: Aug. 27, 2013

(54) STATE ESTIMATION METHOD AND STATE ESTIMATION APPARATUS OF ELECTRIC STORAGE ELEMENT

(75) Inventors: Kenji Takahashi, Aichi (JP); Yuji Nishi, Aichi (JP); Nobuyasu Haga, Aichi (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 13/500,006

(22) PCT Filed: Oct. 5, 2010

(86) PCT No.: PCT/JP2010/005961
§ 371 (c)(1),
(2), (4) Date: Apr. 3, 2012

(87) PCT Pub. No.: WO2012/046266
PCT Pub. Date: Apr. 12, 2012

(65) Prior Publication Data
US 2012/0209551 A1    Aug. 16, 2012

(51) Int. Cl.
*G01R 31/36* (2006.01)
*G06F 19/00* (2011.01)

(52) U.S. Cl.
USPC .............................. 702/63; 324/430; 702/130

(58) Field of Classification Search
USPC ......... 702/53, 63, 65, 99, 130, 131; 324/427, 324/430
See application file for complete search history.

(56) References Cited

U.S. PATENT DOCUMENTS
2008/0204031 A1 *  8/2008  Iwane et al. ................. 324/430

FOREIGN PATENT DOCUMENTS

| JP | 09-092347 A | 4/1997 |
|---|---|---|
| JP | 10-064598 A | 3/1998 |
| JP | 2001-076769 A | 3/2001 |
| JP | 2001-085071 A | 3/2001 |
| JP | 2004-257781 A | 9/2004 |
| JP | 2006-205449 A | 6/2006 |
| JP | 2007-157348 A | 6/2007 |
| JP | 2008-217269 A | 9/2008 |
| JP | 2008-232758 A | 10/2008 |
| JP | 2008-243373 A | 10/2008 |
| JP | 2008-249459 A | 10/2008 |
| JP | 2008-271781 A | 11/2008 |
| JP | 2009-103471 A | 5/2009 |

* cited by examiner

*Primary Examiner* — John H Le
(74) *Attorney, Agent, or Firm* — Sughrue Mion, PLLC

(57) ABSTRACT

A method includes the steps of calculating the temperature of a reference point in an electric storage element by using a detected temperature by a temperature sensor attached to an outer face of the electric storage element and a heat conduction equation, and estimating the internal state of the electric storage element by using the calculated temperature of the reference point. The reference point is a lattice point at which a temperature associated with the internal resistance of the electric storage element is shown, out of a plurality of lattice points provided in the electric storage element.

12 Claims, 8 Drawing Sheets

STATE ESTIMATION METHOD AND STATE ESTIMATION APPARATUS OF ELECTRIC STORAGE ELEMENT

CROSS REFERENCE TO RELATED APPLICATION

This application is a National Stage of International Application No. PCT/JP2010/005961, filed on Oct. 5, 2010, the contents of all of which are incorporated herein by reference in their entirety.

TECHNICAL FIELD

The present invention relates to a method and an apparatus for estimating the temperature in an electric storage element and for estimating the internal state of the electric storage element based on the estimated temperature.

BACKGROUND ART

In control of charge and discharge of a cell, the temperature of the cell is detected and the detected temperature is used as one of control parameters. A temperature sensor such as a thermocouple is used for detecting the temperature of the cell, and the temperature sensor is attached to an outer face of the cell.

PRIOR ART DOCUMENTS

Patent Documents

Patent Document 1: Japanese Patent Laid-Open No. 09 (1997)-092347
Patent Document 2: Japanese Patent Laid-Open No. 2001-085071
Patent Document 3: Japanese Patent Laid-Open No. 2008-217269
Patent Document 4: Japanese Patent Laid-Open No. 2006-205449
Patent Document 5: Japanese Patent Laid-Open No. 2004-257781
Patent Document 6: Japanese Patent Laid-Open No. 2007-157348
Patent Document 7: Japanese Patent Laid-Open No. 2008-271781
Patent Document 8: Japanese Patent Laid-Open No. 2008-232758
Patent Document 9: Japanese Patent Laid-Open No. 2008-243373
Patent Document 10: Japanese Patent Laid-Open No. 10 (1998)-064598
Patent Document 11: Japanese Patent Laid-Open No. 2001-076769

SUMMARY OF THE INVENTION

Problems to be Solved by the Invention

The distribution of temperature is not uniform in the cell due to heat radiation or the like. Typically, the temperature at the center of the cell tends to be higher than the temperature at the outer face of the cell. In the cell having such temperature distribution, only the output from the temperature sensor attached to the outer face of the cell cannot provide the temperature in the cell.

Means for Solving the Problems

A state estimation method of an electric storage element according to a first aspect of the present invention includes the steps of calculating the temperature of a reference point in the electric storage element by using a detected temperature by a temperature sensor attached to an outer face of the electric storage element and a heat conduction equation, and estimating the internal state of the electric storage element by using the calculated temperature of the reference point. The reference point is a lattice point at which the temperature associated with the internal resistance of the electric storage element is shown, out of a plurality of lattice points provided in the electric storage element.

The following expression (I) can be used as the heat conduction equation:

$$\frac{T_i(t + \Delta t) - T_i(t)}{\Delta t} = \left(\frac{\lambda}{\rho c}\right) \frac{T_{i+1}(t) - 2T_i(t) + T_{i-1}(t)}{\Delta x^2} + \frac{q_i(t)}{\rho c} \quad \text{(I)}$$

where T represents temperature, t represents time, $\lambda$ represents thermal conductivity, $\rho$ represents density, c represents specific heat, x represents a thermal diffusion distance, q represents a heat generation amount per unit volume, and a subscript i represents a value at the reference point.

As a method of setting the reference point, a map representing the relationship between the temperature and the internal resistance in the electric storage element is first formed by using the electric storage element in the state in which temperature distribution is uniformized. Then, the internal resistance of the electric storage element is measured, and the temperature associated with the measured internal resistance is specified by using the map. Next, the temperature at each of the plurality of lattice points is calculated by using the detected temperature by the temperature sensor and the heat conduction equation, and one of the plurality of lattice points is set as the reference point, the one showing a temperature closest to the temperature associated with the internal resistance.

The following expression (II) can also be used as the heat conduction equation:

$$\frac{T_p(t + \Delta t) - T_p(t)}{\Delta t} = k_1 \left(\frac{\lambda}{\rho c}\right) \frac{T_s(t) - 2T_p(t) + T_s(t)}{\Delta x^2} + k_2 \frac{q_p(t)}{\rho c} \quad \text{(II)}$$

where Tp represents temperature at the reference point, Ts represents the detected temperature by the temperature sensor, t represents time, $\lambda$ represents thermal conductivity, $\rho$ represents density, c represents specific heat, x represents a thermal diffusion distance, $q_p$ represents a heat generation amount per unit volume at the reference point, and k1 and k2 represent correction coefficients. The correction coefficients k1 and k2 can be set as appropriate such that the expression (II) provides the temperature at the reference point.

The electric storage element can be formed of an electric generating component and a case accommodating the electric generating component. The electric generating component can be configured by stacking a positive electrode element, a separator, and a negative electrode element. Specifically, the electric generating component can be configured by winding a laminate including the stacked positive electrode element, separator, and negative electrode element. The plurality of lattice points can be provided in the stacking direction of the electric generating component.

SOC (State Of Charge) or SOH (State Of Health) can be estimated as the internal state of the electric storage element. The SOC is a value which indicates the charging rate of the electric storage element. The SOH is a ratio of a fully charged amount in the initial state to a fully charged amount after deterioration and serves as an indicator of the deterioration state of the electric storage element.

A state estimation apparatus of an electric storage element according to a second aspect of the present invention includes a temperature sensor attached to an outer face of the electric storage element, and a controller estimating the internal state of the electric storage element. The controller calculates the temperature of a reference point in the electric storage element by using a detected temperature by the temperature sensor and a heat conduction equation, and estimates the internal state by using the calculated temperature of the reference point. The reference point is a lattice point at which the temperature associated with the internal resistance of the electric storage element is shown, out of a plurality of lattice points provided in the electric storage element.

Effect of the Invention

According to the present invention, the reference point (lattice point) showing the temperature associated with the internal resistance of the electric storage element is specified, so that the calculation of the temperature of the reference point allows the estimation of the temperature associated with the internal resistance. When the temperature associated with the internal resistance is used in estimating the internal state of the electric storage element in view of the temperature, the accuracy of the estimation of the internal state can be improved.

MODE FOR CARRYING OUT THE INVENTION

Embodiments of the present invention will hereinafter be described.

Embodiment 1

Figure 1:
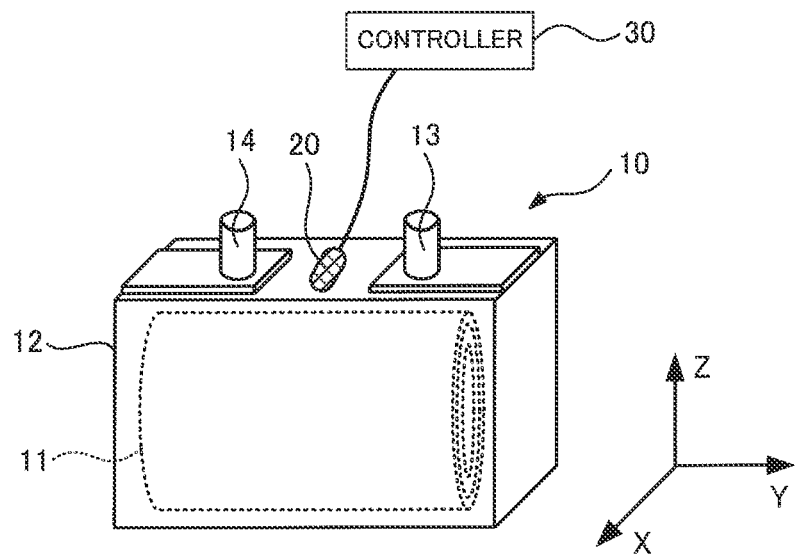
FIG. 1 is a schematic diagram showing the configuration of a cell.

First, the structure of a cell (which corresponds to an electric storage element) will be described with reference to FIG. 1. FIG. 1 is a schematic diagram showing the configuration of a cell 10. In FIG. 1, an X axis, a Y axis, and a Z axis are axes orthogonal to each other, and the relationship among the X axis, the Y axis, and the Z axis applies to the other figures. A secondary battery such as a nickel metal hydride battery or a lithium-ion battery can be used as the cell 10. An electric double layer capacitor can also be used instead of the secondary battery.

Figure 2:
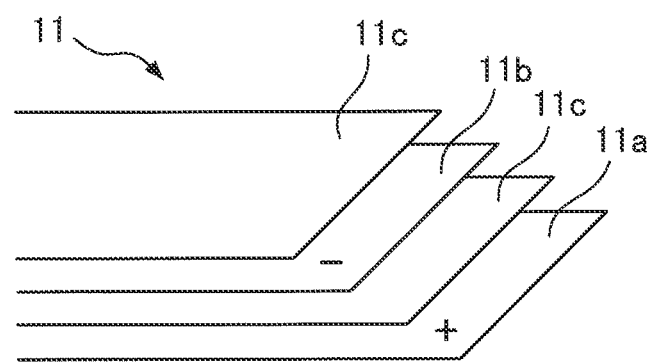
FIG. 2 is a schematic diagram showing the configuration of an electric generating component.

The cell 10 has an electric generating component 11 and a cell case 12 which accommodates the electric generating component 11. The electric generating component 11 is a component which achieves charge and discharge and has a positive electrode element 11a, a negative electrode element 11b, and a separator (which contains an electrolyte solution) 11c placed between the positive electrode element 11a and the negative electrode element 11b as shown in FIG. 2. The electric generating component 11 is configured by winding a laminate (the configuration shown in FIG. 2) including the stacked positive electrode element 11a, separator 11c, and negative electrode element 11b around the Y axis (see FIG. 1).

While the electric generating component 11 is configured by winding the laminate including the stacked positive electrode element 11a, separator 11c, and negative electrode element 11b in the present embodiment, the present invention is not limited thereto. For example, the electric generating component 11 can be configured simply by stacking the positive electrode element 11a, the separator 11c, and the negative electrode element 11b. While the electrolyte solution is contained in the separator 11c in the present embodiment, a solid electrolyte can be placed between the positive electrode element 11a and the negative electrode element 11b. A polymer solid electrolyte or an inorganic solid electrolyte can be used as the solid electrolyte.

Figure 3:
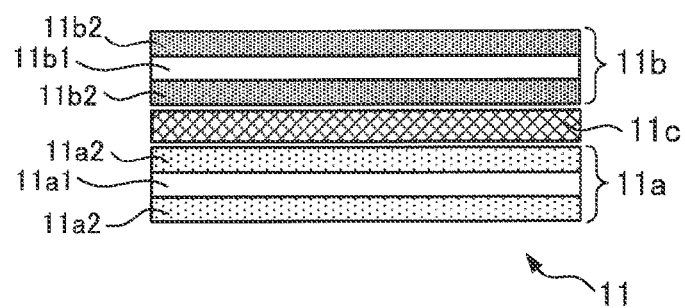
FIG. 3 is a section view showing the configuration of the electric generating component.

As shown in FIG. 3, the positive electrode element 11a includes a positive electrode active material layer 11a2 formed on each surface of a collector plate 11a1, and the positive electrode active material layer 11a2 is made of a positive electrode active material, a conductive agent and the like. The negative electrode element 11b includes a negative electrode active material layer 11b2 formed on each surface of a collector plate 11b1, and the negative electrode active material layer 11b2 is made of a negative electrode active material, a conductive agent and the like. The configurations of the positive electrode element 11a and the negative electrode element 11b are not limited to those shown in FIG. 3. For example, it is possible to use an electrode element (bipolar electrode) in which a positive electrode active material layer is formed on one of faces of a collector plate and a negative electrode active material layer is formed on the other face.

The cell case 12 can be formed of metal, for example. A positive electrode terminal 13 and a negative electrode terminal 14 are provided on a top face of the cell case 12. The positive electrode terminal 13 is electrically connected to the positive electrode element 11a of the electric generating component 11, and the negative electrode terminal 14 is electrically connected to the negative electrode element 11b of the electric generating component 11.

In the configuration shown in FIG. 1, a temperature sensor 20 is provided on the top face of the cell case 12, and the temperature sensor 20 is used for detecting the temperature of the cell 10. An output signal from the temperature sensor 20 is input to a controller 30 which can obtain the temperature information of the cell 10 based on the output from the temperature sensor 20. Since the temperature sensor 20 is attached to an outer face of the cell 10 (cell case 12), the detected temperature by the temperature sensor 20 is the temperature on the outer face of the cell 10.

A thermocouple can be used as the temperature sensor 20, for example. The position where the temperature sensor 20 is attached to the cell case 12 can be set as appropriate. When a plurality of cells 10 are placed side by side in the X direction, the temperature sensor 20 is preferably placed on the top face of the cell case 12 as in the present embodiment.

Figure 4:
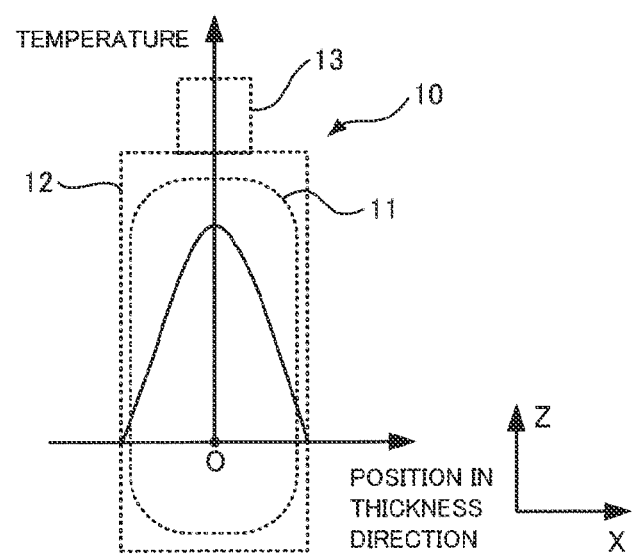
FIG. 4 is a diagram showing temperature distribution in a cell.

Next, temperature properties in the cell 10 will be described with reference to FIG. 4. FIG. 4 shows a coordinate system in which the vertical axis represents the temperature and the horizontal axis represents the thickness of the cell 10 and the internal structure of the cell 10 superposed on the coordinate system. The thickness of the cell 10 refers to the length of the cell 10 in the X direction. The direction of the horizontal axis shown in FIG. 4 is the direction in which the positive electrode element 11a, the separator 11c, and the negative electrode element 11b are stacked. FIG. 4 shows (an illustrative) temperature distribution in the cell 10. A central point O shown in FIG. 4 indicates the position corresponding to the center of the electric generating component 11 in the thickness direction of the cell 10.

The cell 10 (electric generating component 11) generates heat with charge and discharge, and the temperature distribution shown in FIG. 4 occurs due to heat radiation or the like. The heat escapes most easily and thus the temperature is most likely to be at the lowest level in the portion of the electric generating component 11 that is in contact with the cell case 12. On the other hand, the heat escapes less easily and thus the temperature tends to be higher at a position closer to the central point O.

As shown in FIG. 4, the temperature varies in the cell 10 depending on the position in the thickness direction of the cell 10. In the present embodiment, the temperature associated with the internal resistance of the electric generating component 11 is used as the temperature of the cell 10 (hereinafter referred to as performance temperature), and the performance temperature of the cell 10 is estimated as described below.

In the present embodiment, the heat conduction equation shown in the following expression (1) is used for estimating the performance temperature of the cell 10:

$$\frac{\partial T}{\partial t} = \left(\frac{\lambda}{\rho c}\right)\frac{\partial T^2}{\partial x^2} + \frac{q}{\rho c} \quad (1)$$

In the expression (1), T represents temperature, t represents time, $\lambda$ represents thermal conductivity, $\rho$ represents density, c represents specific heat, x represents a thermal diffusion distance, and q represents a heat generation amount per unit volume. In the right side of the expression (1), the first term shows the thermal diffusion term and the second term shows the heat generation term.

While the one-dimensional heat conduction equation is used in the present embodiment, a two-dimensional or three-dimensional heat conduction equation can be used. When the one-dimensional heat conduction equation is used as in the present embodiment, the computation processing for estimating the performance temperature of the cell 10 can be simplified.

The expression (1) can be differentiated as the following expression (2):

$$\frac{T_i(t+\Delta t) - T_i(t)}{\Delta t} = \left(\frac{\lambda}{\rho c}\right)\frac{T_{i+1}(t) - 2T_i(t) + T_{i-1}(t)}{\Delta x^2} + \frac{q_i(t)}{\rho c} \quad (2)$$

Figure 5:
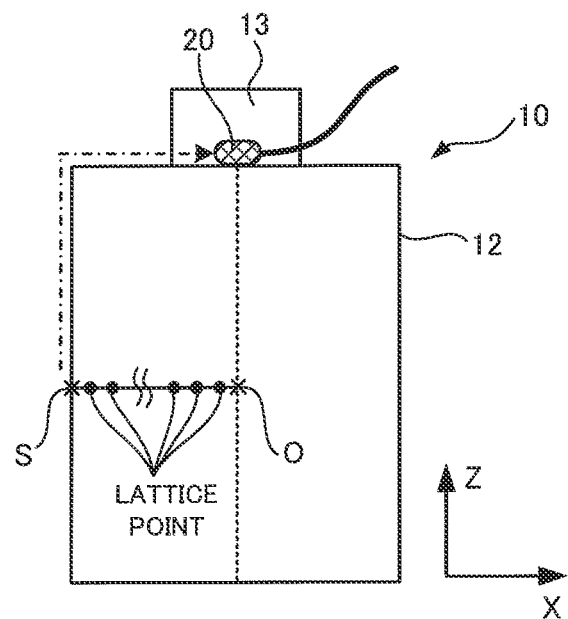
FIG. 5 is a diagram for explaining a plurality of lattice points having different positions in a thickness direction of the cell.
Figure 6:
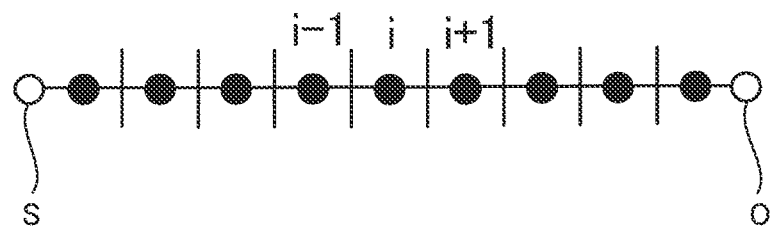
FIG. 6 is a diagram for explaining the plurality of lattice points.

In the expression (2), i represents a lattice point in the thickness direction of the cell 10. The lattice point refers to a point in each of sub-regions of the cell 10 when the region between the central point O and a point S is divided into a plurality of sub-regions in the thickness direction as shown in FIG. 5 and FIG. 6. The point S is at the farthest position from the central point O in the thickness direction of the cell 10 and is located on the outer face of the cell case 12.

The number of the lattice points can be set as appropriate. When the number of the lattice points is increased, the estimation accuracy of the temperature depending on the position in the thickness direction of the cell 10 can be improved. On the other hand, when the number of the lattice points is reduced, the computation processing in estimating the temperature depending on the position in the thickness direction of the cell 10 can be simplified.

As shown in the expression (2), the temperature of the lattice point i is affected by the temperatures at two lattice points (i−1) and (i+1) adjacent to the lattice point i. The temperature of the point S is regarded as the temperature detected by the temperature sensor 20. In other words, the temperature of the point S is regarded as being substantially equal to the temperature of the portion where the temperature sensor 20 is attached. When the cell case 12 is formed of metal having excellent heat conduction, the temperature of the point S is substantially equal to the temperature of the portion where the temperature sensor 20 is attached.

While the present embodiment focuses on the thickness direction (X direction) of the cell 10 as shown in FIG. 4, the present invention is not limited thereto. Since the electric generating component 11 is a three-dimensional cube, not only the position in the X direction but also the position in the Z direction or the Y direction can be considered. The position to be considered varies depending on the heat transfer path in the cell 10.

As regards the dimensions of the cell 10 in the three-dimensional directions (the X direction, the Y direction, and the Z direction), the cell 10 in the present embodiment has the smallest dimension in the X direction. Thus, the heat conduction path along the X direction is most predominant of all the heat conduction paths in the cell 10. For this reason, the estimation of the temperature in the cell 10 is preferably performed with focus on the temperature depending on the position in the thickness direction (X direction) of the cell 10 as in the present embodiment.

Figure 7:
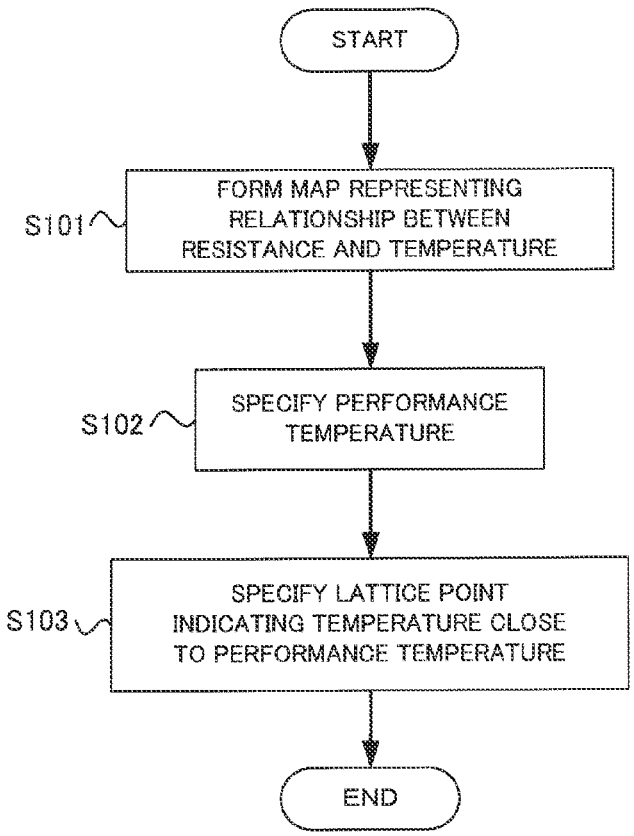
FIG. 7 is a flow chart for explaining a method of specifying a lattice point at which performance temperature is shown.

Next, description will be made of a method of specifying the lattice point (which corresponds to a reference point) i at which the performance temperature of the cell 10 is shown. FIG. 7 is a flow chart for explaining the method of specifying the lattice point i at which the performance temperature is shown. The method of specifying the lattice point i will be described with reference to the flow chart shown in FIG. 7.

At step S101, a map representing the relationship between the resistance and the temperature of the cell 10 is formed. Specifically, the relationship between the resistance and the temperature is obtained by using the cell 10 with its temperature variations suppressed sufficiently. More particularly, after the entire cell 10 is caused to be at a substantially uniform temperature, the resistance of the cell 10 is measured. To cause the entire cell 10 to be at a substantially uniform temperature, the cell 10 can be let stand over a sufficient time period at a particular temperature, for example. The resistance is measured while the temperature of the cell 10 is changed, so that the map shown in FIG. 8, for example, is obtained.

Figure 8:
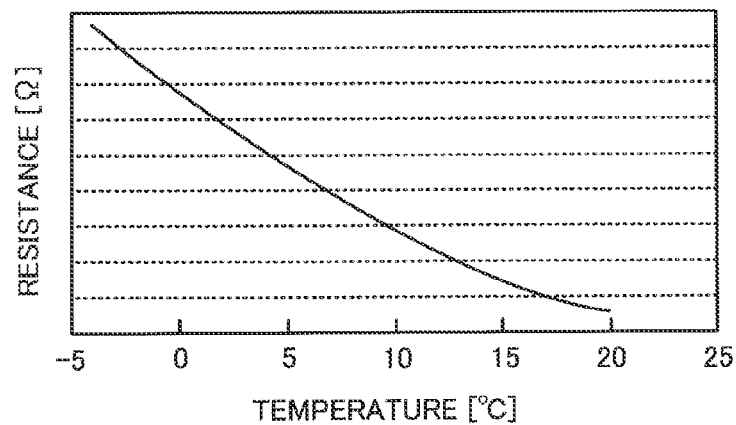
FIG. 8 is a graph showing the relationship between the resistance and the temperature of the cell.

The map shown in FIG. 8 indicates that the resistance (internal resistance) and the performance temperature of the cell 10 have a correspondence. When the resistance is measured by using the cell 10 with its temperature variations suppressed sufficiently, the correspondence between the internal resistance and the performance temperature of the cell 10 is found. Through the use of the map shown in FIG. 8, the performance temperature can be specified from the measurement of the resistance of the cell 10.

At step S102 in FIG. 7, the performance temperature of the cell 10 is specified. The performance temperature is used for specifying the lattice point i.

Figure 9:
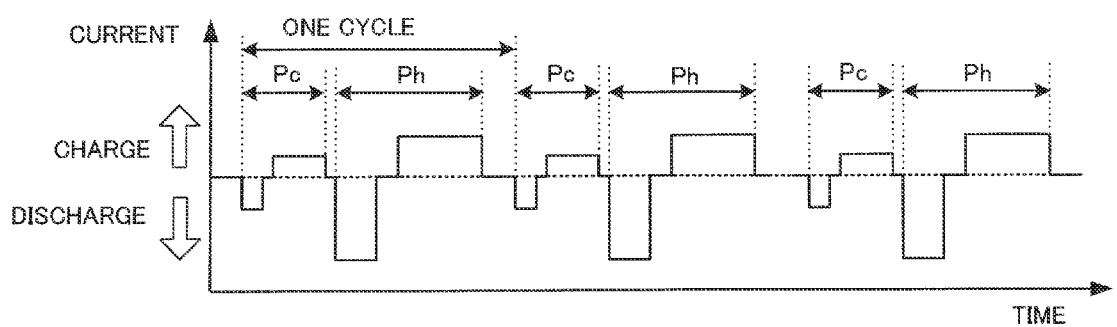
FIG. 9 is a diagram showing a charge and discharge pattern in a heat generation period.
Figure 10:
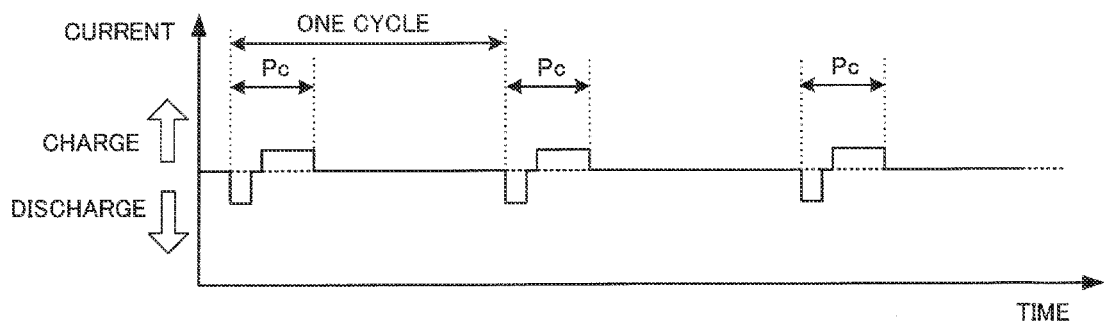
FIG. 10 is a diagram showing a charge and discharge pattern in a temperature mitigation period.

First, charge and discharge are performed on the basis of patterns shown in FIG. 9 and FIG. 10. The temperature of the cell 10 is detected on the basis of the output from the temperature sensor 20 and the performance temperature is specified with the map shown in FIG. 8. The charge and discharge in the pattern shown in FIG. 9 is performed over a period in which the cell 10 is caused to generate heat (heat generation period). The charge and discharge in the pattern shown in FIG. 10 is performed over a period in which the temperature variations of the cell 10 are mitigated (temperature mitigation period). After the charge and discharge in the pattern shown in FIG. 9 is performed, the charge and discharge in the pattern shown in FIG. 10 is performed.

As shown in FIG. 9, in the heat generation period, charge and discharge including a first pattern Pc and a second pattern Ph is set to one cycle, and this cycle is repeatedly performed. The first pattern Pc is used for measuring the resistance of the cell 10. The second pattern Ph is used for causing the cell 10 (electric generating component 11) to generate heat. The number of the charge and discharge cycles shown in FIG. 9 can be set as appropriate. Specifically, the charge and discharge cycle can be repeatedly performed until the cell 10 is caused to generate heat and no significant temperature change is detected in the cell 10.

In the present embodiment, the resistance is measured two seconds after the start of the charge and discharge in the first pattern Pc. The time of the measurement of the resistance is not limited to the point two seconds after the start of the charge and discharge in the first pattern Pc but can be set to another point. It is only required that the time of the measurement of the resistance should be the same point in each of the cycles. For example, the resistance can be measured one second or ten seconds after the start of the charge and discharge in the first pattern Pc. The charge and discharge in the second pattern Ph can be performed to cause the cell 10 to generate heat and to measure the resistance after the lapse of a predetermined time period. In this case, the charge and discharge in the first pattern Pc can be omitted. The charge and discharge in the first pattern Pc can be additionally performed to cause the cell 10 to generate heat.

The pattern used for measuring the resistance of the cell 10 is not limited to the pattern shown in FIG. 9. While the pulses for the charge and discharge are produced in the first pattern Pc shown in FIG. 9, only the pulse for the charge or discharge can be produced. In addition, for the second pattern Ph shown in FIG. 9, only the pulse for the charge or discharge can also be produced. The second pattern Ph is only required to allow the cell 10 to generate heat. The charge and discharge can be performed alternately so as to provide the same coulomb amount as in the first pattern Pc and the second pattern Ph shown in FIG. 9, so that the SOC (State Of Charge) of the cell 10 can be held substantially constant.

After the charge and discharge cycle shown in FIG. 9 is finished, that is, after the heat generation period is finished, a charge and discharge cycle shown in FIG. 10 is repeatedly performed. In the charge and discharge shown in FIG. 10, only the charge and discharge in the first pattern Pc is performed as one cycle, and this cycle is repeatedly performed. Since a sufficient non-operating time (time period in which charge or discharge is not performed) is ensured after the charge and discharge in the first pattern Pc is performed and before the next charge and discharge is performed, the temperature change of the cell 10 (electric generating component 11) is significantly small. The number of the charge and discharge cycles shown in FIG. 10 can be set as appropriate. Specifically, the charge and discharge cycle shown in FIG. 10 can be repeatedly performed until no significant temperature change is detected in the cell 10 after the heat generation of the cell 10 is stopped.

Figure 11:
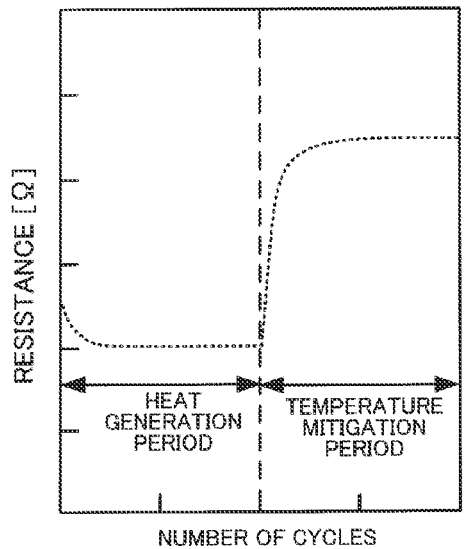
FIG. 11 is a diagram showing the resistance in the heat generation period and the temperature mitigation period.

FIG. 11 shows the resistances measured in the heat generation period and the temperature mitigation period. In FIG. 11, the vertical axis represents the resistance of the cell 10 and the horizontal axis represents the number of the charge and discharge cycles (in other words, the time). As shown in FIG. 11, when the heat generation period is switched to the temperature mitigation period, the resistance of the cell 10 is increased. The performance temperature can be specified on the basis of the resistances shown in FIG. 11 and the map shown in FIG. 8.

Figure 12:
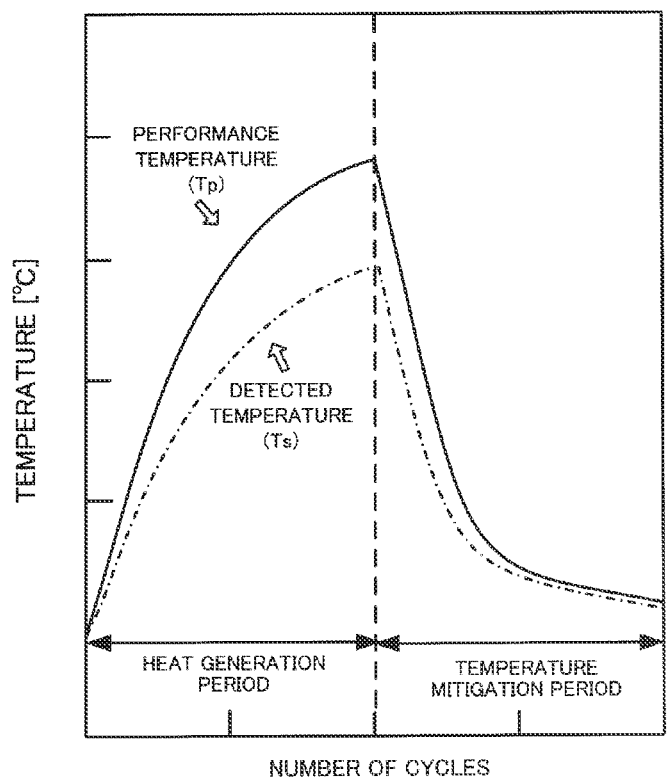
FIG. 12 is a diagram showing the performance temperature and detected temperature in the heat generation period and the temperature mitigation period.

FIG. 12 shows the relationship between the detected temperature by the temperature sensor 20 and the performance temperature specified by using the map shown in FIG. 8. In FIG. 12, the vertical axis represents the temperature and the horizontal axis represents the number of the charge and discharge cycles (in other words, the time). The distribution shown by a dashed line in FIG. 12 indicates the detected temperature Ts by the temperature sensor 20 and the distribution shown by a solid line in FIG. 12 indicates the performance temperature Tp. As shown in FIG. 12, the detected temperature Ts and the performance temperature Tp have similar behaviors, but in the heat generation period, the performance temperature Tp is higher than the detected temperature Ts. The difference between the performance temperature Tp and the detected temperature Ts in the temperature mitigation period is smaller than the difference between the performance temperature Tp and the detected temperature Ts in the heat generation period.

At step S103 in FIG. 7, the lattice point i showing the temperature change closest to the temperature change of the performance temperature Tp is specified. The temperature of each of the lattice points can be calculated on the basis of the detected temperature Ts by the temperature sensor 20 and the heat conduction equation shown in the expression (2). Specifically, since the temperature of the point S is the detected temperature Ts in FIG. 5 and FIG. 6, the temperature of the lattice point adjacent to the point S can be calculated by using the heat conduction equation shown in the expression (2). This calculation method allows the calculation of the temperatures at the plurality of lattice points. The temperature closest to the performance temperature Tp can be specified out of the temperatures at the plurality of lattice points to specify the lattice point at which the performance temperature is shown. The information about the specified lattice point can be stored in memory.

For estimating the temperature of the cell 10, the temperature of the lattice point i associated with the performance temperature is calculated on the basis of the detected temperature by the temperature sensor 20 and the heat conduction equation shown in the expression (2). The calculation processing is performed by the controller 30 (see FIG. 1). The temperature of the lattice point i is used as the temperature of the cell 10 for various types of control of the cell 10.

For example, the temperature adjustment of the cell 10 can be performed on the basis of the temperature of the lattice point i (performance temperature). When the temperature of the lattice point i rises, a heat exchange medium for cooling can be supplied to the cell 10 to suppress the temperature rise of the cell 10.

In addition, the SOC of the cell 10 can be estimated on the basis of the temperature of the lattice point i (performance temperature). Since the SOC of the cell 10 has a correspondence with the voltage or the current of the cell 10, the SOC of the cell 10 can be estimated by detecting the voltage or the current. The relationship between the SOC and the voltage or the relationship between the SOC and the current change depending on the temperature. Thus, the relationship between the SOC and the voltage is previously provided for each temperature such that the SOC can be estimated on the basis of the voltage and the temperature. Alternatively, the relationship between the SOC and the current is previously provided for each temperature such that the SOC can be estimated on the basis of the current and the temperature.

In addition, the SOH of the cell 10 can be estimated on the basis of the temperature of the lattice point i (performance temperature). In Patent Document 5, the SOH is estimated on the basis of the open circuit voltage and the accumulated current amount, and the open circuit voltage is corrected with temperature. In this case, the performance temperature described in the present embodiment can be used as temperature information for correcting the open circuit voltage.

According to the present embodiment, the temperature associated with the internal resistance of the cell 10 can be estimated. In addition, the internal state (such as the SOC) of the cell 10 is estimated on the basis of the estimated temperature (performance temperature), so that the estimation accuracy of the internal state can be improved. Especially, the estimation accuracy of the SOC can be improved in the state where the temperature drops and the SOC is reduced.

Figure 13:
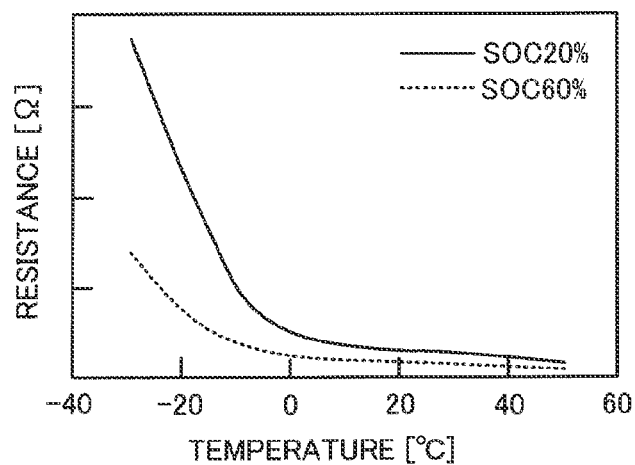
FIG. 13 is a graph showing the relationship among the resistance, the temperature, and the SOC of the cell.

FIG. 13 shows the relationship among the resistance, the temperature, and the SOC of the cell 10. In FIG. 13, the vertical axis represents the resistance and the horizontal axis represents the temperature. FIG. 13 also shows distributions when the SOC is 20% and 60%. As shown in FIG. 13, the resistance of the cell 10 is higher as the SOC is lower. In addition, the resistance of the cell 10 is higher as the temperature is lower.

As shown in FIG. 13, in a high-temperature region, the internal resistance of the cell 10 does not tend to be changed even when the temperature or the SOC is changed. On the other hand, in a low-temperature region, the internal resistance of the cell 10 is significantly changed when the temperature is slightly changed. As the internal resistance is shifted, the estimation error of the SOC is larger. The estimation accuracy of the SOC or the SOH can be improved by estimating the performance temperature associated with the internal resistance as in the present embodiment.

The cell 10 in the present embodiment can constitute an assembled battery which can be mounted on a vehicle. Electric energy output from the assembled battery can be converted by a motor generator into kinetic energy for running the vehicle. The motor generator converts kinetic energy generated in braking of the vehicle into electric energy which is stored in the assembled battery.

When the assembled battery can be charged from outside of the vehicle, the discharge (running) can be performed until the SOC of the cell 10 is reduced to the lowest possible level. For reducing the SOC to the lowest possible level, the estimation accuracy of the SOC needs to be improved. As shown in FIG. 13, when the SOC is low, the estimation accuracy of the SOC cannot be improved unless the estimation accuracy of the temperature is improved. In such a case, the estimation of the performance temperature can be performed as in the present embodiment to improve the estimation accuracy of the SOC.

Embodiment 2

Next, Embodiment 2 of the present invention will be described. Embodiment 1 involves specifying the lattice point associated with the performance temperature out of the plurality of lattice points provided in the thickness direction of the cell 10 and estimating the temperature of the specified lattice point as the temperature of the cell 10. In the present embodiment, only three lattice points are used to calculate the performance temperature of a cell 10. The characteristics of the present embodiment will hereinafter be described specifically. It should be noted that members having the same functions as those of the members described in Embodiment 1 are designated with the same reference numerals, and detailed description thereof is omitted.

Figure 14:
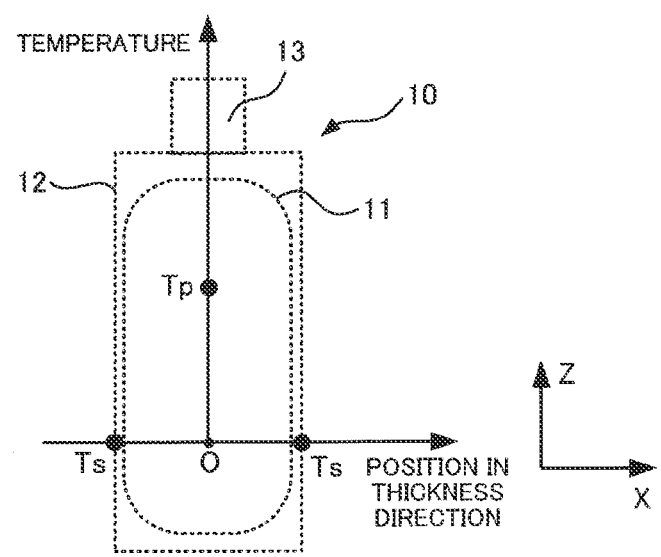
FIG. 14 is a diagram when three lattice points are provided in a cell in Embodiment 2.

FIG. 14 shows the relationship between the positions in a thickness direction of the cell 10 and the temperature when the three lattice points are set. In the example shown in FIG. 14, out of the three lattice points, the temperature of the lattice point in the cell 10 is set to the performance temperature Tp, and the temperature of the lattice point on the surface of the cell 10 is set to the detected temperature Ts by a temperature sensor 20. The temperature of another lattice point can be used instead of the detected temperature Ts.

The heat conduction equation when the three lattice points are set can be simplified as the following expression (3):

$$\frac{T_P(t+\Delta t) - T_P(t)}{\Delta t} = k_1\left(\frac{\lambda}{\rho c}\right)\frac{T_s(t) - 2T_P(t) + T_s(t)}{\Delta x^2} + k_2\frac{q_p(t)}{\rho c} \quad (3)$$

The expression (3) can be represented by the following expression (4):

$$T_S(t+\Delta t) = T_P(t) + \alpha(T_S(t) - T_P(t)) + \beta q(t) \quad (4)$$

In this case, α and β are represented by the following expressions (5) and (6):

$$\alpha = \frac{2k_1 \lambda \Delta t}{\rho c \Delta x^2} \quad (5)$$

$$\beta = \frac{k_2 \Delta t}{\rho c} \quad (6)$$

In the expression (3) and the expressions (5) and (6), k1 and k2 represent correction coefficients and can be determined with the method described below, for example.

First, as described with reference to FIG. 12, the performance temperature of the cell 10 is previously calculated. Next, while each of the correction coefficients k1 and k2 is changed, the temperature (estimated temperature) estimated to be the performance temperature is calculated through the use of the expressions (3) and (4). Then, the correction coefficients k1 and k2 when the difference between the performance temperature and the estimated temperature is the minimum are specified.

Figure 15:
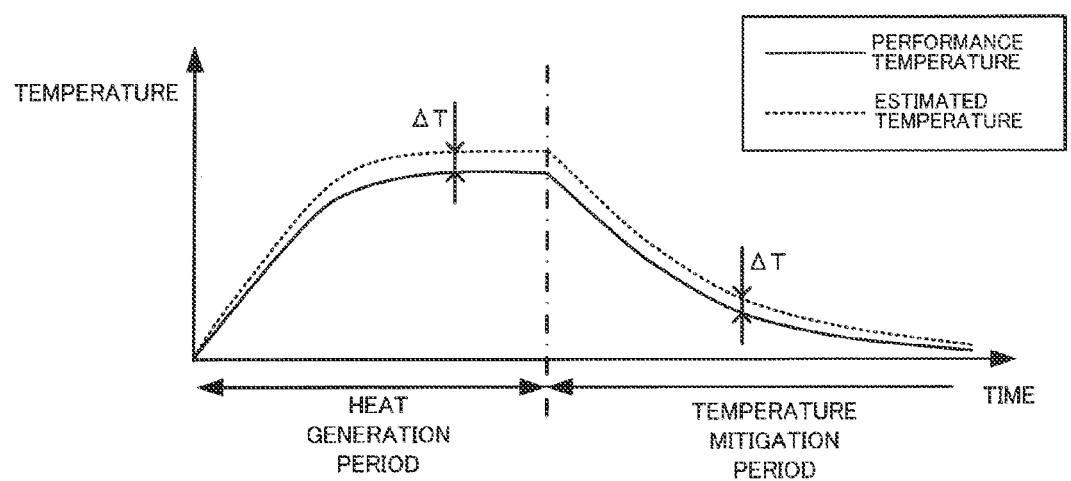
FIG. 15 is a graph for explaining a method of calculating correction coefficients k1 and k2 in Embodiment 2.

FIG. 15 shows (an illustrative) relationship between the performance temperature and the estimated temperature. In a heat generation period, similarly to Embodiment 1, charge and discharge are performed alternately in a first pattern Pc and a second pattern Ph to cause the cell 10 to generate heat. In a temperature mitigation period, similarly to Embodiment 1, charge and discharge are performed only in the first pattern Pc, so that the cell 10 is not caused to generate heat but the temperature of the cell 10 is caused to reach the temperature depending on the ambient temperature. The charge and discharge in the second pattern Ph can be performed to cause the cell 10 to generate heat and to measure the resistance after the lapse of a predetermined time period. In this case, the charge and discharge in the first pattern Pc can be omitted. The charge and discharge in the first pattern Pc can be additionally performed to cause the cell 10 to generate heat.

As described in Embodiment 1, the resistance of the cell 10 is measured in the heat generation period and the temperature mitigation period, and the measured resistance and the map shown in FIG. 8 are used to specify the performance temperature. The distribution of the performance temperature is shown by a solid line in FIG. 15. On the other hand, the detected temperature by the temperature sensor 20 obtained in the heat generation period and the temperature mitigation period is substituted into the heat conduction equation shown in the expression (3) and the correction coefficients k1 and k2 are set as appropriate, thereby specifying the estimated temperature. In FIG. 15, (an illustrative) distribution of the estimated temperature is shown by a dotted line.

As shown in FIG. 15, when the estimated temperature is higher than the performance temperature, the correction coefficients k1 and k2 are changed so as to reduce the estimated temperature closer to the performance temperature. When the estimated temperature is lower than the performance temperature, the correction coefficients k1 and k2 are changed so as to increase the estimated temperature closer to the performance temperature. In other words, the correction coefficients k1 and k2 are determined so that the difference $\Delta T$ between the estimated temperature and the performance temperature is brought closer to zero.

The processing of determining the correction coefficients k1 and k2 can be performed on the basis of the difference $\Delta T$ between the estimated temperature and the performance temperature in the heat generation period or on the basis of the difference $\Delta T$ between the estimated temperature and the performance temperature in the temperature mitigation period. The obtained correction coefficients k1 and k2 (or $\alpha$ and $\beta$) can be stored in memory. Thus, once the detected temperature Ts by the temperature sensor 20 is obtained, the performance temperature Tp can be calculated on the basis of the expression (3).

The performance temperature Tp associated with the internal resistance can also be calculated in the present embodiment. When the performance temperature is used as the temperature of the cell 10, the estimation accuracy of the internal state of the cell 10 (such as the SOC and the SOH) can be improved as in Embodiment 1. Since the performance temperature Tp is calculated by taking account of the minimum number of lattice points in the present embodiment, the computation load in calculating the performance temperature Tp can be reduced.

The invention claimed is:

1. A state estimation method of an electric storage element, comprising the steps of:
    calculating a temperature of a reference point inside the electric storage element by using a detected temperature by a temperature sensor attached to an outer face of the electric storage element and a heat conduction equation; and
    estimating an internal state of the electric storage element by using the calculated temperature of the reference point,
    wherein the reference point is a lattice point at which a temperature associated with an internal resistance of the electric storage element is shown, out of a plurality of lattice points representing different positions inside the electric storage element.

2. The state estimation method of the electric storage element according to claim 1, wherein the heat conduction equation is represented by a following expression (I):

$$\frac{T_i(t+\Delta t) - T_i(t)}{\Delta t} = \left(\frac{\lambda}{\rho c}\right)\frac{T_{i+1}(t) - 2T_i(t) + T_{i-1}(t)}{\Delta x^2} + \frac{q_i(t)}{\rho c} \quad \text{(I)}$$

where T represents a temperature, t represents a time, $\lambda$ represents a thermal conductivity, $\rho$ represents a density, c represents a specific heat, x represents a thermal diffusion distance, q represents a heat generation amount per unit volume, and a subscript i represents a value at the reference point.

3. The state estimation method of the electric storage element according to claim 1, further comprising the steps of:
    measuring an internal resistance of the electric storage element;
    specifying a temperature associated with the measured internal resistance by using a map, the map being formed by using the electric storage element in a state in which temperature distribution is uniformized, the map representing a relationship between a temperature and an internal resistance in the electric storage element;
    calculating a temperature at each of the plurality of lattice points by using the detected temperature by the temperature sensor and the heat conduction equation; and
    setting one of the plurality of lattice points as the reference point, the one showing a temperature closest to the temperature associated with the internal resistance.

4. The state estimation method of the electric storage element according to claim 1, wherein the heat conduction equation is represented by a following expression (II):

$$\frac{T_p(t+\Delta t) - T_p(t)}{\Delta t} = k_1\left(\frac{\lambda}{\rho c}\right)\frac{T_s(t) - 2T_p(t) + T_s(t)}{\Delta x^2} + k_2\frac{q_p(t)}{\rho c} \quad \text{(II)}$$

where Tp represents a temperature at the reference point, Ts represents the detected temperature by the temperature sensor, t represents a time, $\lambda$ represents a thermal conductivity, $\rho$ represents a density, c represents a specific heat, x represents a thermal diffusion distance, $q_p$ represents a heat generation amount per unit volume at the reference point, and k1 and k2 represent correction coefficients.

5. The state estimation method of the electric storage element according to claim 1, wherein the electric storage element has an electric generating component and a case accommodating the electric generating component, the electric generating component is formed by stacking a positive electrode element, a separator, and a negative electrode element, and the plurality of lattice points have different positions in a stacking direction of the electric generating component.

6. The state estimation method of the electric storage element according to claim 1, wherein the internal state of the electric storage element is SOC or SOH.

7. A state estimation apparatus of an electric storage element, comprising:

a temperature sensor attached to an outer face of the electric storage element; and a controller estimating an internal state of the electric storage element, wherein the controller calculates a temperature of a reference point inside the electric storage element by using a detected temperature by the temperature sensor and a heat conduction equation, and estimates the internal state by using the calculated temperature of the reference point, and the reference point is a lattice point at which a temperature associated with an internal resistance of the electric storage element is shown, out of a plurality of lattice points representing different positions inside the electric storage element.

8. The state estimation apparatus of the electric storage element according to claim 7, wherein the heat conduction equation is represented by a following expression (III):

$$\frac{T_i(t+\Delta t)-T_i(t)}{\Delta t}=\left(\frac{\lambda}{\rho c}\right)\frac{T_{i+1}(t)-2T_i(t)+T_{i-1}(t)}{\Delta x^2}+\frac{q_i(t)}{\rho c} \quad \text{(III)}$$

where T represents a temperature, t represents a time, $\lambda$ represents a thermal conductivity, $\rho$ represents a density, c represents a specific heat, x represents a thermal diffusion distance, q represents a heat generation amount per unit volume, and a subscript i represents a value at the reference point.

9. The state estimation apparatus of the electric storage element according to claim 7, wherein an internal resistance of the electric storage element is measured, a temperature associated with the measured internal resistance is specified by using a map, the map being formed by using the electric storage element in a state in which temperature distribution is uniformized, the map representing a relationship between a temperature and an internal resistance in the electric storage element, and when a temperature at each of the plurality of lattice points is calculated by using the detected temperature by the temperature sensor and the heat conduction equation, the reference point is one of the plurality of lattice points, the one showing a temperature closest to the temperature associated with the internal resistance.

10. The state estimation apparatus of the electric storage element according to claim 7, wherein the heat conduction equation is represented by a following expression (IV):

$$\frac{T_p(t+\Delta t)-T_p(t)}{\Delta t}=k_1\left(\frac{\lambda}{\rho c}\right)\frac{T_s(t)-2T_p(t)+T_s(t)}{\Delta x^2}+k_2\frac{q_p(t)}{\rho c} \quad \text{(IV)}$$

where Tp represents a temperature at the reference point, Ts represents the detected temperature by the temperature sensor, t represents a time, $\lambda$ represents a thermal conductivity, $\rho$ represents a density, c represents a specific heat, x represents a thermal diffusion distance, $q_p$ represents a heat generation amount per unit volume at the reference point, and k1 and k2 represent correction coefficients.

11. The state estimation apparatus of the electric storage element according to claim 7, wherein the electric storage element has an electric generating component and a case accommodating the electric generating component, the electric generating component is formed by stacking a positive electrode element, a separator, and a negative electrode element, and the plurality of lattice points have different positions in a stacking direction of the electric generating component.

12. The state estimation apparatus of the electric storage element according to claim 7, wherein the internal state of the electric storage element is SOC or SOH.

* * * * *